(12) United States Patent
Lee et al.

(10) Patent No.: US 12,069,895 B2
(45) Date of Patent: *Aug. 20, 2024

(54) DISPLAY APPARATUS HAVING SHIELDING ELECTRODE OVERLAPPING CONNECTION LINE

(71) Applicant: SAMSUNG DISPLAY CO., LTD., Yongin-si (KR)

(72) Inventors: Jieun Lee, Yongin-si (KR); Minchae Kwak, Yongin-si (KR); Byungsun Kim, Yongin-si (KR); Ilgoo Youn, Yongin-si (KR); Seunghan Jo, Yongin-si (KR); Junyoung Jo, Yongin-si (KR); Minhee Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/457,732

(22) Filed: Dec. 6, 2021

(65) Prior Publication Data

US 2022/0093713 A1 Mar. 24, 2022

Related U.S. Application Data

(63) Continuation of application No. 16/938,087, filed on Jul. 24, 2020, now Pat. No. 11,195,893.

(30) Foreign Application Priority Data

Jul. 25, 2019 (KR) .................. 10-2019-0090497

(51) Int. Cl.
*H01L 29/12* (2006.01)
*H10K 59/121* (2023.01)
(Continued)

(52) U.S. Cl.
CPC ..... *H10K 59/1213* (2023.02); *H10K 59/1216* (2023.02); *H10K 59/126* (2023.02); *H10K 59/131* (2023.02); *H01L 27/1225* (2013.01)

(58) Field of Classification Search
CPC ............. H10K 59/1213; H10K 59/131; H10K 59/126; H10K 59/1216; H01L 27/1225
(Continued)

(56) References Cited

U.S. PATENT DOCUMENTS 9,954,047 B2 4/2018 Kim et al.
11,195,893 B2 * 12/2021 Lee .................... H10K 59/1213
(Continued)

FOREIGN PATENT DOCUMENTS

CN 110299384 A * 10/2019 ........... G09G 3/3225
CN 111754936 A * 10/2020 ........... G09G 3/3233
(Continued)

*Primary Examiner* — Phuc T Dang
(74) *Attorney, Agent, or Firm* — CHAU & ASSOCIATES, LLC

(57) ABSTRACT

Provided is a display apparatus including: a substrate in which a display element is arranged; a first thin film transistor arranged in the display area and including a first semiconductor layer including silicon and a first control electrode insulated from the first semiconductor layer; a first interlayer insulating layer covering the first control electrode; a second thin film transistor arranged on the first interlayer insulating layer and including a second semiconductor layer including an oxide semiconductor and a second control electrode insulated from the second semiconductor layer; a second interlayer insulating layer covering the second control electrode; a node connection line arranged on the second interlayer insulating layer and connected to the first control electrode via a first contact hole; a first planarization layer covering the node connection line; and a (Continued)

shielding electrode arranged on the first planarization layer to overlap the node connection line.

30 Claims, 11 Drawing Sheets

(51) Int. Cl.
  *H10K 59/126* (2023.01)
  *H10K 59/131* (2023.01)
  *H01L 27/12* (2006.01)

(58) Field of Classification Search
  USPC .......................................................... 257/71
  See application file for complete search history.

(56) References Cited

U.S. PATENT DOCUMENTS

| | | |
|---|---|---|
| 2013/0146866 A1 | 6/2013 | Kitagawa et al. |
| 2013/0235018 A1 | 9/2013 | Tanaka |
| 2017/0005156 A1* | 1/2017 | Kim ...................... G09G 3/3233 |
| 2017/0278869 A1 | 9/2017 | Hiramatsu et al. |
| 2017/0278916 A1 | 9/2017 | Maruyama |
| 2017/0330515 A1 | 11/2017 | Jeong et al. |
| 2017/0330927 A1* | 11/2017 | Lee ...................... H10K 59/1213 |
| 2018/0151654 A1 | 5/2018 | Lee |
| 2018/0197474 A1 | 7/2018 | Jeon et al. |
| 2018/0366586 A1* | 12/2018 | Son ...................... H01L 27/1255 |
| 2019/0006521 A1* | 1/2019 | Noh ...................... H01L 27/1262 |
| 2020/0194529 A1 | 6/2020 | Lee et al. |
| 2021/0028258 A1 | 1/2021 | Lee et al. |

FOREIGN PATENT DOCUMENTS

| | | | |
|---|---|---|---|
| EP | 3557623 | 10/2019 | |
| KR | 10-2017-0124679 | 11/2017 | |
| KR | 10-2018-0137640 | 12/2018 | |
| KR | 10-2019-0030670 | 3/2019 | |
| KR | 20190025120 A1 * | 3/2019 | ........... H10K 59/131 |
| KR | 10-2020-0073347 | 6/2020 | |
| WO | WO-2020091165 A1 * | 5/2020 | ........... G09G 3/3233 |

* cited by examiner

DISPLAY APPARATUS HAVING SHIELDING ELECTRODE OVERLAPPING CONNECTION LINE

CROSS-REFERENCE TO RELATED APPLICATION

This application is a continuation of U.S. application Ser. No. 16/938,087 filed on Jul. 24, 2020, issued as U.S. patent Ser. No. 11/195,893 on Dec. 7, 2021, which claims the benefit of Korean Patent Application No. 10-2019-0090497, filed on Jul. 25, 2019, in the Korean Intellectual Property Office, the disclosure of each of which is incorporated by reference herein in its entirety.

BACKGROUND

1. Field

The present invention relates to a display apparatus, and more particularly, to a display apparatus driven by using a thin film transistor including a silicon semiconductor layer and a thin film transistor including an oxide semiconductor layer.

2. Description of the Related Art

Display apparatuses typically include a display element and a driving circuit to control an electrical signal applied to the display element. The driving circuit includes a thin film transistor (TFT), a storage capacitor, and a plurality of lines.

To accurately control whether a display element emits light or a degree of light emission, the number of thin film transistors electrically connected to one display element has increased. Accordingly, research into addressing the high integration degree and power consumption of display apparatuses is actively conducted.

SUMMARY

One or more embodiments include a display apparatus driven by a thin film transistor including a silicon semiconductor and a thin film transistor including an oxide semiconductor to reduce power consumption of the display apparatus and allow a high integration degree at the same time.

However, the above objective is exemplary, and the scope of the present disclosure is not limited thereto.

Additional aspects will be set forth in part in the description which follows and, in part, will be apparent from the description, or may be learned by practice of the presented embodiments of the disclosure.

According to an exemplary embodiment of the present invention, a display apparatus includes a substrate including a display area in which a display element is arranged, a first thin film transistor arranged in the display area and including a first semiconductor layer including silicon and a first control electrode insulated from the first semiconductor layer, a first interlayer insulating layer covering the first control electrode, a second thin film transistor arranged on the first interlayer insulating layer and including a second semiconductor layer including an oxide semiconductor and a second control electrode insulated from the second semiconductor layer, a second interlayer insulating layer covering the second control electrode, a node connection line arranged on the second interlayer insulating layer and connected to the first control electrode via a first contact hole, a first planarization layer covering the node connection line, and a shielding electrode arranged on the first planarization layer to overlap the node connection line.

According to an exemplary embodiment of the present invention, a display apparatus includes a substrate including a display area in which a display element is arranged, a first thin film transistor arranged in the display area and including a silicon semiconductor layer and a first control electrode insulated from the silicon semiconductor layer, a first interlayer insulating layer covering the first control electrode, a second thin film transistor arranged on the first interlayer insulating layer and including an oxide semiconductor layer and a second control electrode insulated from the oxide semiconductor layer, and a boost capacitor including a lower electrode and an upper electrode. The lower and upper electrodes are arranged on a first layer and the upper electrode and the oxide semiconductor layer are arranged on a second layer different from the first layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
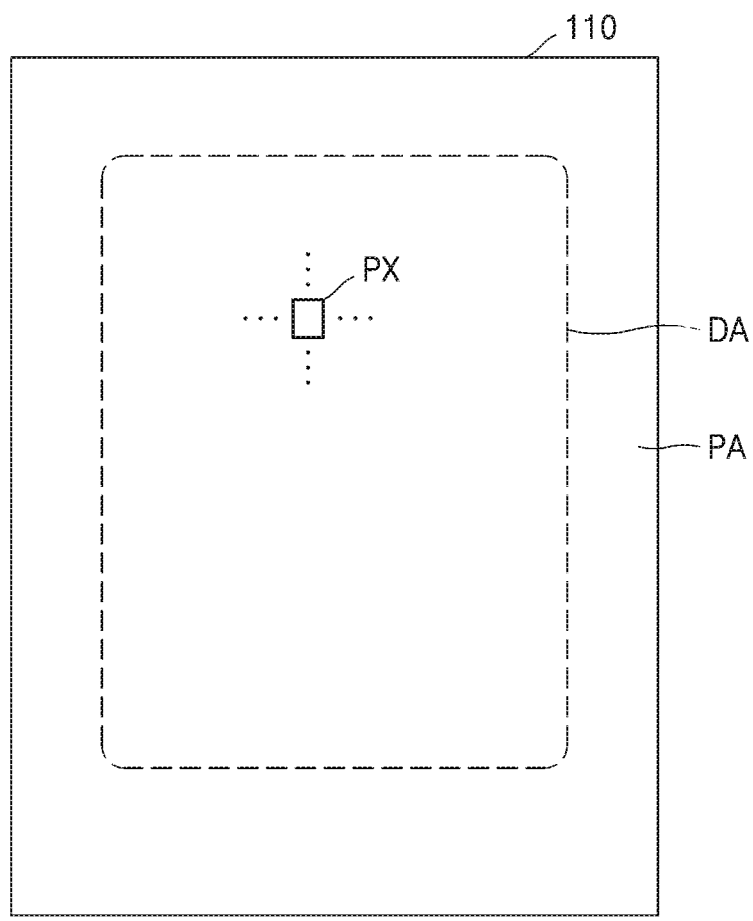
FIG. 1 is a schematic view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The embodiments will be described below in more detail with reference to the accompanying drawings. Those components that are the same or are in correspondence are rendered the same reference numeral regardless of the figure number, and repeated description thereof will be omitted.

It will be understood that although the terms "first," "second," etc. may be used herein to describe various components, these components should not be limited by these terms. These components are only used to distinguish one component from another.

Singular expressions, unless defined otherwise in contexts, include plural expressions.

In the embodiments below, it will be further understood that the terms "comprise" and/or "have" used herein specify the presence of stated features or components, but do not preclude the presence or addition of one or more other features or components.

In the embodiments below, it will be understood when a portion such as a layer, an area, or an element is referred to as being "on" or "above" another portion, it can be directly on or above the other portion, or intervening portion may also be present.

Also, in the drawings, for convenience of description, sizes of elements may be exaggerated or contracted. In other words, since sizes and thicknesses of components in the drawings are arbitrarily illustrated for convenience of explanation, the following embodiments are not limited thereto.

When an embodiment is implementable in another manner, a predetermined process order may be different from a described one. For example, two processes that are consecutively described may be substantially simultaneously performed or may be performed in an opposite order to the described order.

In the embodiments below, when a layer, an area, or an element is "connected," it may be construed that the layer, area, or element is connected not only directly but also indirectly through other constituent elements therebetween. For example, when a layer, an area, an element, or the like is described as being electrically connected, the layer, the area, the element, or the like may be not only directly electrically connected but also indirectly through another layer, area, element, or the like therebetween.

Figure 2:
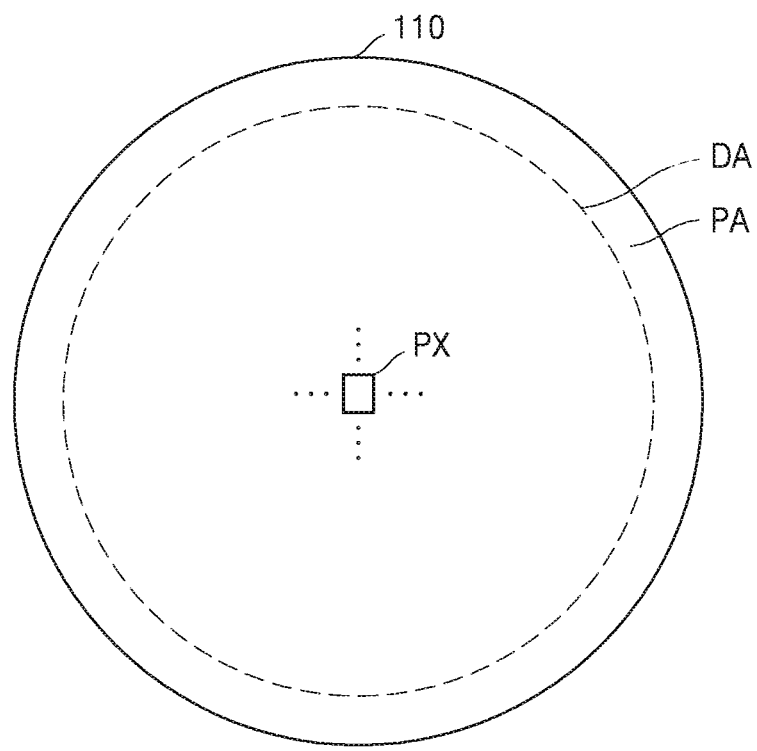
FIG. 2 is a schematic view of a display apparatus according to an embodiment.

FIGS. 1 and 2 are schematic views of a display apparatus according to embodiments.

A substrate 110 may be partitioned into a display area DA displaying an image and a peripheral area PA arranged around the display area DA.

The substrate 110 may include various materials such as glass, metal, or plastic. According to an embodiment, the substrate 110 may include a flexible material. A flexible material refers to a substrate that is easily bent and curved or folded or rolled. The substrate 110 formed of a flexible material as described above may include an ultra-thin glass, metal or plastic.

In the display area DA of the substrate 110, pixels PX including various display elements such as an organic light-emitting diode (OLED) may be arranged. A plurality of pixels PX are included and may be arranged in various forms such as a stripe arrangement, a Pentile-arrangement, a mosaic arrangement or the like to realize an image.

In a plan view, the display area DA may have a rectangular shape as illustrated in FIG. 1 or a circle shape as illustrated in FIG. 2. According to another embodiment, the display area DA may have a polygonal shape such as a triangle, a pentagon, a hexagon, or the like, or an oval shape, an irregular shape, or the like.

The peripheral area PA of the substrate 110 is arranged around the display area DA and may be an area where no image is displayed. In the peripheral area PA, pads, on which various lines, a printed circuit board, or a driver integrated circuit (IC) chip that transfer an electrical signal to be applied the display area DA are attached, may be located.

Hereinafter, a display apparatus including an organic light-emitting diode as a display element will be described for convenience. However, the embodiments may be applied to various types of display apparatus such as liquid crystal display apparatuses, electrophoretic display apparatuses, inorganic electroluminescent (EL) display apparatuses, or the like.

Figure 3:
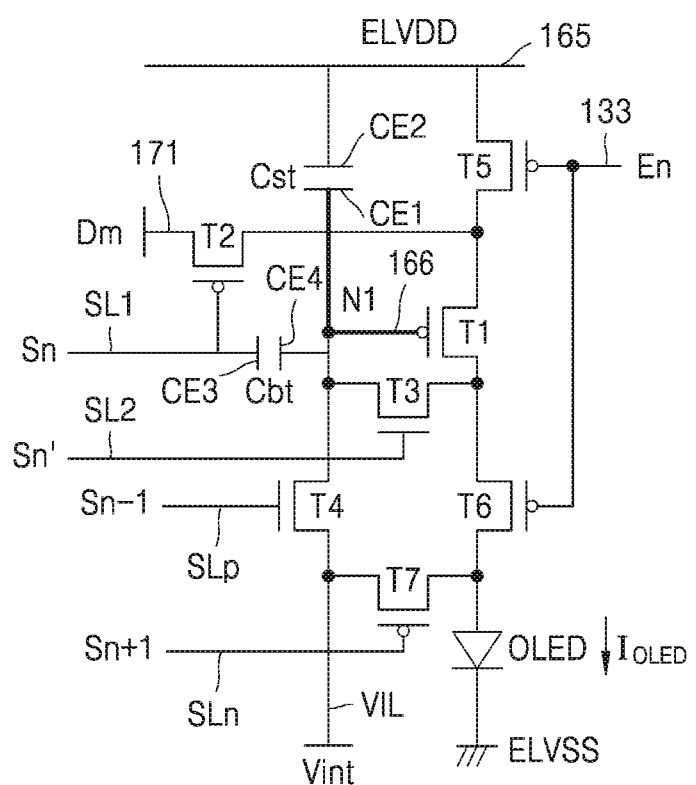
FIG. 3 is an equivalent circuit diagram of a pixel included in a display apparatus according to embodiments.

FIG. 3 is an equivalent circuit diagram of a pixel included in a display apparatus according to embodiments.

Referring to FIG. 3, a pixel PX includes signal lines SL1, SL2, SLp, SLn, 133, and 171, a plurality of thin film transistors T1, T2, T3, T4, T5, T6, and T7 connected to the signal lines SL1, SL2, SLp, SLn, 133, and 171, a storage capacitor Cst, a boost capacitor Cbt, an initialization voltage line VIL, a driving voltage line 165, and an organic light-emitting diode OLED as a display element. In some embodiments, at least one of the signal lines SL1, SL2, SLp, SLn, 133, and 171, and the initialization voltage line VIL or/and the driving voltage line 165 may be shared between neighboring pixels PX.

The thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

Some of the plurality of thin film transistors T1, T2, T3, T4, T5, T6, and T7 may be an n-channel metal oxide semiconductor field effect transistor (MOSFET) (NMOS), and the others may be a p-channel metal oxide semiconductor field effect transistor (MOSFET) (PMOS).

For example, as illustrated in FIG. 3, the compensation thin film transistor T3 and the first initialization thin film transistor T4 from among the plurality of thin film transistors T2, T3, T4, T5, T6, and T7 may be an NMOS, and the others may be a PMOS.

According to another embodiment, the compensation thin film transistor T3, the first initialization thin film transistor T4, and the second initialization thin film transistor T7 from among the plurality of thin film transistors T2, T3, T4, T5, T6, and T7 may be an NMOS, and the others may be a PMOS. Alternatively, only one of the plurality of thin film transistors T2, T3, T4, T5, T6, and T7 may be an NMOS, and the others may be a PMOS. Alternatively, all of the plurality of thin film transistors T2, T3, T4, T5, T6, and T7 may be an NMOS.

The signal lines SL1, SL2, SLp, SLn, 133, and 171 may include a first scan line SL1 transferring a first scan signal Sn, a second scan line SL2 transferring a second scan signal Sn', a previous scan line SLp transferring a previous scan signal Sn−1 to the first initialization thin film transistor T4, an emission control line 133 transferring an emission control signal En to the operation control thin film transistor T5 and the emission control thin film transistor T6, a next scan line SLn transferring a next scan signal Sn+1 to the second initialization thin film transistor T7, and a data line 171 crossing the first scan line SL1 and transferring a data signal Dm.

The driving voltage line 165 transfers a driving voltage ELVDD to the driving thin film transistor T1, and the initialization voltage line VIL transfers an initialization voltage Vint that initializes the driving thin film transistor T1 and a pixel electrode.

Each of the thin film transistors T1 through T7 may include a control electrode, a first electrode, and a second electrode. The control electrode may be a gate electrode. In addition, one of the first and second electrodes may correspond to a source electrode, and the other may correspond to a drain electrode.

A driving control electrode of the driving thin film transistor T1 is connected to the storage capacitor Cst, a driving first electrode of the driving thin film transistor T1 is electrically connected to the driving voltage line 165 via the operation control thin film transistor T5, and a driving second electrode of the driving thin film transistor T1 is electrically connected to a pixel electrode of the organic light-emitting diode OLED via the emission control thin film transistor T6. The driving thin film transistor T1 receives the data signal Dm according to a switching operation of the switching thin film transistor T2 to supply a driving current $I_{OLED}$ via the organic light-emitting diode OLED.

A switching control electrode of the switching thin film transistor T2 is connected to the first scan line SL1, a switching first electrode of the switching thin film transistor T2 is connected to the data line 171, and a switching second electrode of the switching thin film transistor T2 is connected to the driving first electrode of the driving thin film transistor T1 and is connected to the driving voltage line 165 via the operation control thin film transistor T5. The switching thin film transistor T2 is turned on according to the first scan signal Sn received via the first scan line SL1 to perform a switching operation of transferring the data signal Dm transferred to the data line DL, to the driving first electrode of the driving thin film transistor T1.

A compensation control electrode of the compensation thin film transistor T3 is connected to the second scan line SL2. A compensation second electrode of the compensation thin film transistor T3 is connected to the driving second electrode of the driving thin film transistor T1 and is electrically connected to the pixel electrode of the organic light-emitting diode OLED via the emission control thin film transistor T6. A compensation first electrode of the compensation thin film transistor T3 is connected to a first electrode CE1 of the storage capacitor Cst and the driving control electrode of the driving thin film transistor T1 via a node connection line 166. In addition, the compensation first electrode is connected to a first initialization second electrode of the first initialization thin film transistor T4.

The compensation thin film transistor T3 is turned on according to the second scan signal Sn' received via the second scan line SL2 to electrically connect the driving control electrode of the driving thin film transistor T1 to the driving second electrode thereof, thereby diode-connecting the driving thin film transistor T1.

A first initialization control electrode of the first initialization thin film transistor T4 is connected to the previous scan line SLp. A first initialization first electrode of the first initialization thin film transistor T4 is connected to a second initialization first electrode of the second initialization thin film transistor T7 and the initialization voltage line VIL. The first initialization second electrode of the first initialization thin film transistor T4 is connected to the first electrode CE1 of the storage capacitor Cst, the compensation first electrode of the compensation thin film transistor T3, and the driving control electrode of the driving thin film transistor T1. The first initialization thin film transistor T4 is turned on according to the previous signal Sn−1 received via the previous scan line SLp to perform an initialization operation of transferring an initialization voltage Vint to the driving control electrode of the driving thin film transistor T1 to initialize a voltage of the driving control electrode of the driving thin film transistor T1.

An operation control electrode of the operation control thin film transistor T5 is connected to the emission control line 133, and an operation control first electrode of the operation control thin film transistor T5 is connected to the driving voltage line 165, and an operation control second electrode of the operation control thin film transistor T5 is connected to the driving first electrode of the driving thin film transistor T1 and the switching second electrode of the switching thin film transistor T2.

An emission control electrode of the emission control thin film transistor T6 is connected to the emission control line 133, and an emission control first electrode of the emission control thin film transistor T6 is connected to the driving second electrode of the driving thin film transistor T1 and the compensation second electrode of the compensation thin film transistor T3, and an emission control second electrode of the emission control thin film transistor T6 is electrically connected to the second initialization second electrode of the second initialization thin film transistor T7 and the pixel electrode of the organic light-emitting diode OLED.

The operation control thin film transistor T5 and the emission control thin film transistor T6 are simultaneously turned on according to the emission control signal En received via the emission control line 133 such that the driving voltage ELVDD is transferred to the organic light-emitting diode OLED and thus a driving current $I_{OLED}$ flows through the organic light-emitting diode OLED.

A second initialization control electrode of the second initialization thin film transistor T7 is connected to the next scan line SLn, and the second initialization second electrode of the second initialization thin film transistor T7 is connected to the emission control second electrode of the emission control thin film transistor T6 and the pixel electrode of the organic light-emitting diode OLED, and the second initialization first electrode of the second initialization thin film transistor T7 is connected to the first initialization first electrode of the first initialization thin film transistor T4 and the initialization voltage line VIL. The second initialization thin film transistor T7 is turned on according to the next scan signal Sn+1 received via the next scan line SLn to initialize the pixel electrode of the organic light-emitting diode OLED.

The second initialization thin film transistor T7 may be connected to the next scan line SLn as illustrated in FIG. 3. According to another embodiment, the second initialization thin film transistor T7 may be connected to the emission control line 133 to be driven according to the emission control signal En. The positions of the first electrodes and the second electrodes of FIG. 2 may be exchanged according to a type of a transistor (p-type or n-type).

The storage capacitor Cst includes the first electrode CE1 and a second electrode CE2. The first electrode CE1 of the storage capacitor Cst is connected to the driving control electrode of the driving thin film transistor T1, and the second electrode CE2 of the storage capacitor Cst is connected to the driving voltage line 165. The storage capacitor Cst may store a voltage corresponding to a difference between a voltage of the driving control electrode of the driving thin film transistor T1 and the driving voltage ELVDD.

The boost capacitor Cbt includes a third electrode CE3 and a fourth electrode CE4. The third electrode CE3 may be connected to the switching control electrode of the switching thin film transistor T2 and the first scan line SL1, and the fourth electrode CE4 may be connected to the compensation first electrode of the compensation thin film transistor T3 and the node connection line 166. The boost capacitor Cbt may raise a voltage of the first node N1 when the first scan signal Sn supplied to the first scan line SL1 is turned off. When the voltage of the first node N1 is raised as above, black gradation may be clearly expressed.

The first node N1 may be an area where the driving control electrode of the driving thin film transistor T1, the first electrode of the compensation thin film transistor T3, the second electrode of the first initialization thin film transistor T4, and the fourth electrode CE4 of the boost capacitor Cbt are connected.

A detailed operation of each pixel PX according to an embodiment is as follows.

During an initialization period, when the previous scan signal Sn−1 is supplied via the previous scan line SLp, the first initialization thin film transistor T4 is turned on according to the previous scan signal Sn−1, and the driving thin film transistor T1 is initialized by the initialization voltage Vint supplied via the initialization voltage line VIL.

During a data programming period, when the first scan signal Sn and the second scan signal Sn' are supplied via the first scan line SL1 and the second scan line SL2, the switching thin film transistor T2 and the compensation thin film transistor T3 are turned on in response to the first scan signal Sn and the second scan signal Sn'. The driving thin film transistor T1 is here diode-connected via the turned-on compensation thin film transistor T3 and is biased in a forward direction.

Then a compensation voltage (Dm+Vth, Vth has a (−) value), which is a result of subtracting a threshold voltage Vth of the driving thin film transistor T1 from the data signal Dm supplied via the data line 171, is applied to the driving control electrode of the driving thin film transistor T1.

The driving voltage ELVDD and the compensation voltage (Dm+Vth) are applied to opposite electrodes of the storage capacitor Cst, and a charge corresponding to a voltage difference between the opposite electrodes of the storage capacitor Cst is stored in the storage capacitor Cst.

During an emission period, the operation control thin film transistor T5 and the emission control thin film transistor T6 are turned on according to an emission control signal En supplied from the emission control line 133. The driving current $I_{OLED}$ is generated according to a voltage difference between a voltage of the driving control electrode of the driving thin film transistor T1 and the driving voltage ELVDD, and the driving current $I_{OLED}$ flows via the organic light-emitting diode OLED and the emission control thin film transistor T6.

In the present embodiment, at least one of the plurality of thin film transistors T1, T2, T3, T4, T5, T6, and T7 includes a semiconductor layer including an oxide (i.e., an oxide semiconductor layer), and the others include a semiconductor layer including silicon (i.e., a silicon semiconductor layer).

In detail, a driving thin film transistor that directly affects brightness of a display apparatus is configured to include a semiconductor layer formed of polycrystalline silicon having high reliability, and a high-resolution display apparatus may be implemented in this manner.

An oxide semiconductor has a high carrier mobility and a low leakage current, and thus a voltage drop thereof is not great despite a relatively long driving period. That is, even during low-frequency driving, changes in colors of images due to voltage drop are not great, and thus low-frequency driving may be performed.

As the oxide semiconductor has a low leakage current, at least one of the compensation thin film transistor T3, the first initialization thin film transistor T4 that are connected to the driving control electrode of the driving thin film transistor T1 may include an oxide semiconductor to thereby prevent a leakage current that may flow to the driving control electrode and reduce power consumption at the same time.

Figure 4:
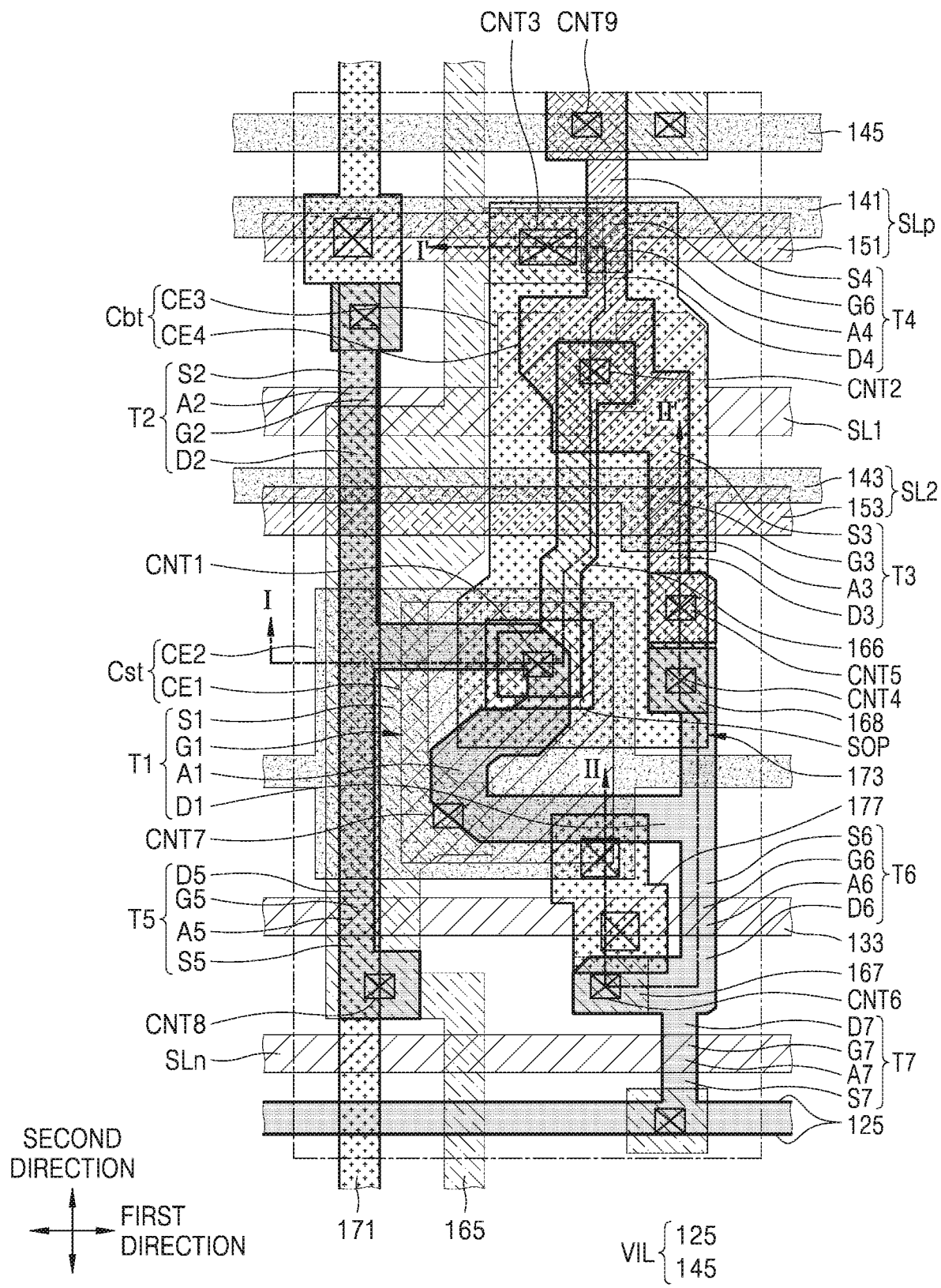
FIG. 4 is a layout diagram showing positions of a plurality of thin film transistors and a storage capacitor arranged in a pixel.
Figure 5A:
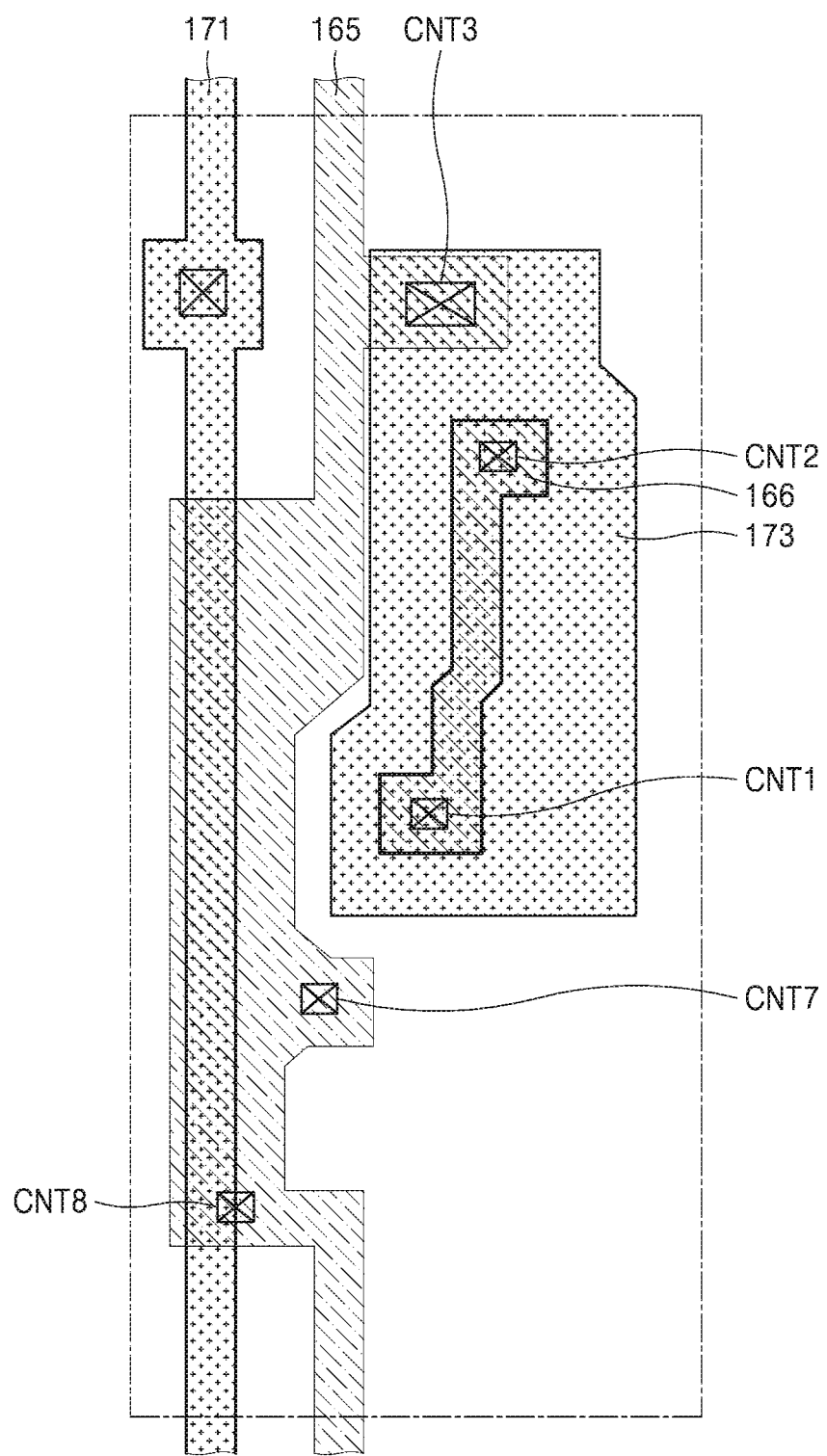
FIG. 5A is an excerpt view of some of the elements illustrated in FIG. 4.
Figure 5B:
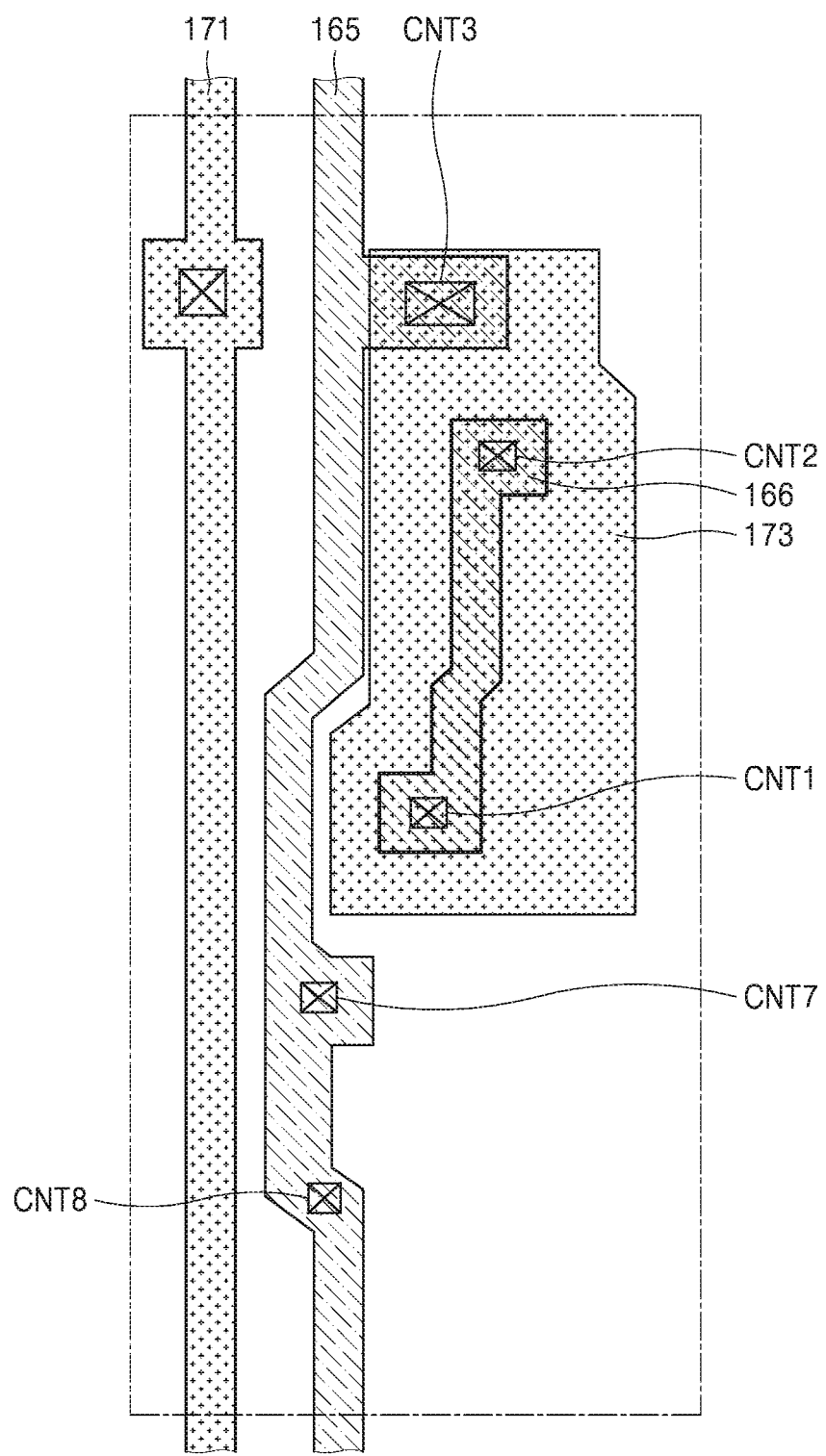
FIG. 5B is an excerpt layout diagram of some components of a display apparatus according to an embodiment.
Figure 5C:
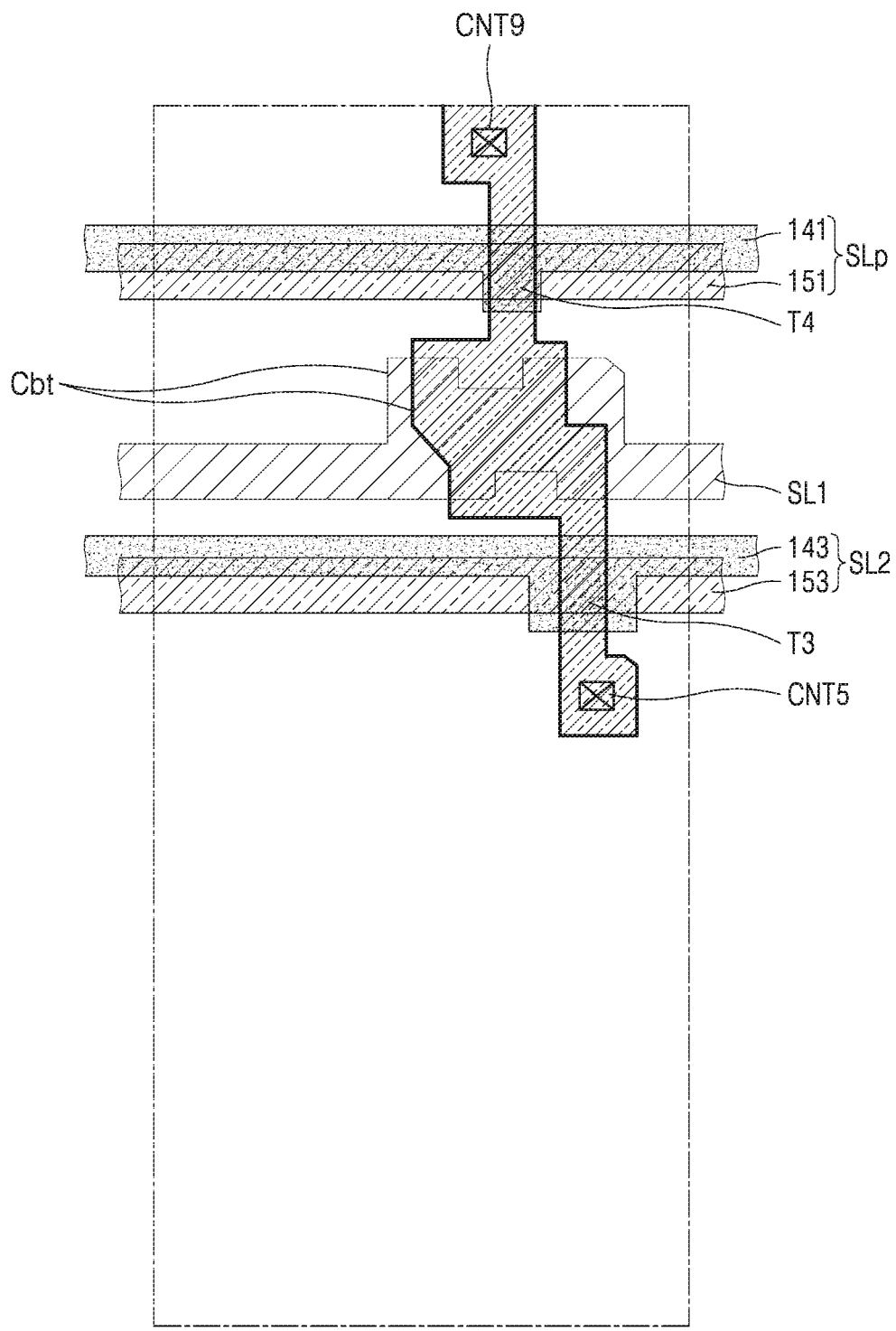
FIG. 5C is an excerpt layout diagram of some components of a display apparatus according to an embodiment.
Figure 6:
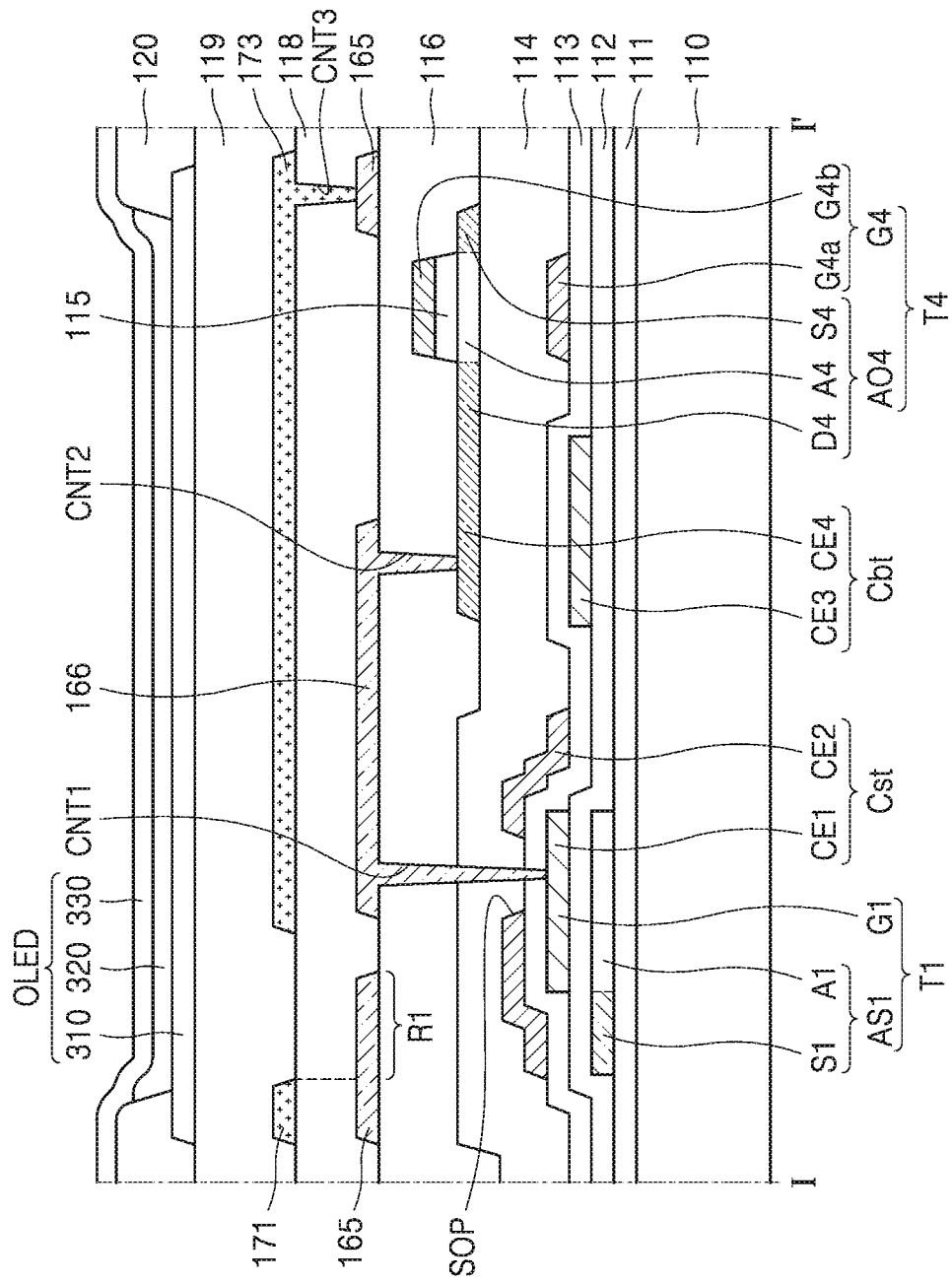
FIG. 6 is a schematic cross-sectional view of FIG. 4 taken along line I-I'.
Figure 7:
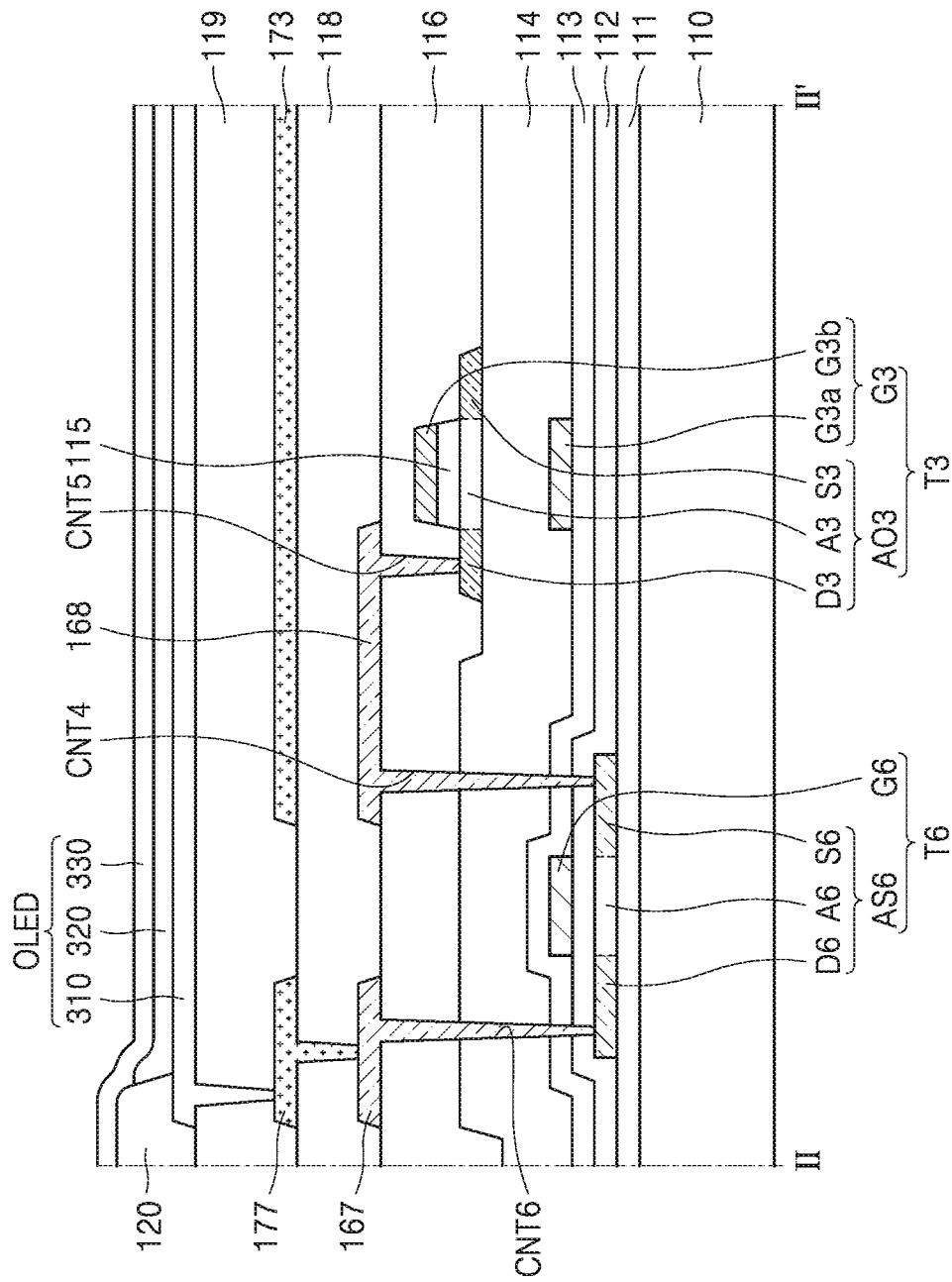
FIG. 7 is a schematic cross-sectional view of FIG. 4 taken along line II-II'.

FIG. 4 is a layout diagram of positions of a plurality of thin film transistors and a storage capacitor arranged in a pixel circuit of a display apparatus, according to an embodiment. FIGS. 5A and 5C are excerpt views of some of the elements illustrated in FIG. 4. FIG. 5B is an excerpt layout diagram of some components of a display apparatus according to an embodiment. FIG. 6 is a schematic cross-sectional view taken along line I-I' of FIG. 4'. FIG. 7 is a schematic cross-sectional view taken along line II-II' of FIG. 4'.

First, referring to FIGS. 4 and 5A, the pixel circuit of the display apparatus according to an embodiment may include the first scan line SL1, the second scan line SL2, the previous scan line SLp, the next scan line SLn, the emission control line 133, and the initialization voltage line VIL that extend in a first direction, and the data line 171 and the driving voltage line 165 that extend in a second direction crossing the first direction. The initialization voltage line VIL may include a first initialization voltage line 125 and a second initialization voltage line 145.

Also, the pixel circuit may include the driving thin film transistor T1, the switching thin film transistor T2, the compensation thin film transistor T3, the first initialization thin film transistor T4, the operation control thin film transistor T5, the emission control thin film transistor T6, the second initialization thin film transistor T7, the storage capacitor Cst, and the boost capacitor Cbt.

According to an embodiment, the driving thin film transistor T1, the switching thin film transistor T2, the operation control thin film transistor T5, the emission control thin film transistor T6 and the second initialization thin film transistor T7 may be a thin film transistor including a silicon semiconductor (e.g., silicon or polycrystalline silicon).

Also, the compensation thin film transistor T3 and the first initialization thin film transistor T4 may be a thin film transistor including an oxide semiconductor.

Semiconductor layers of the driving thin film transistor T1, the switching thin film transistor T2, the operation control thin film transistor T5, the emission control thin film transistor T6, and the second initialization thin film transistor T7 are arranged on a same layer and include a same material. For example, the semiconductor layers may include polycrystalline silicon.

The semiconductor layers of the driving thin film transistor T1, the switching thin film transistor T2, the operation control thin film transistor T5, the emission control thin film transistor T6, and the second initialization thin film transistor T7 may be arranged on the buffer layer 111 (see FIG. 6) arranged on the substrate 110.

The semiconductor layers of the driving thin film transistor T1, the switching thin film transistor T2, the operation control thin film transistor T5, the emission control thin film transistor T6, and the second initialization thin film transistor T7 may be connected to each other and may be bent in various shapes.

The semiconductor layers of the driving thin film transistor T1, the switching thin film transistor T2, the operation control thin film transistor T5, the emission control thin film transistor T6, and the second initialization thin film transistor T7 may each include a channel area and a source and a drain area on two opposite sides of the channel area. For example, the source area and the drain area may be doped with impurities, and the impurities may include N-type impurities or P-type impurities. The source area and the drain area may respectively correspond to a first electrode and a second electrode. The source area and the drain area may be exchanged according to the properties of a transistor. Hereinafter, the terms 'source area' and 'drain area' will be used instead of a first electrode or a second electrode.

The driving thin film transistor T1 includes a driving semiconductor layer AS1 and the driving control electrode G1. The driving semiconductor layer AS1 includes a driving channel area A1 and a driving source area S1 and a driving drain area D1 on two opposite sides of the driving channel area A1. The driving semiconductor layer AS1 has a curved shape such that the driving channel area A1 is longer than other channel areas A2 through A7. For example, as the driving semiconductor layer AS1 has a shape including multiple bends, such as an omega shape or an alphabet "S," a long channel length may be provided in a relatively narrow space. As the driving channel area A1 has a relatively long length, a driving range of a gate voltage applied to the driving control electrode G1 is broadened, thereby finely controlling gradation of light emitted from the organic light-emitting diode OLED and improving display quality. In some embodiments, the driving semiconductor layer AS1 may be provided not in a bent shape but in a linear shape. The driving control electrode G1 may be an island type and included to overlap the driving channel area A1 with a first gate insulating layer 112 (see FIG. 6) therebetween.

The storage capacitor Cst may be arranged to overlap the driving thin film transistor T1. The storage capacitor Cst includes the first electrode CE1 and the second electrode CE2. The driving control electrode G1 may function not only as a control electrode of the driving thin film transistor T1 but also as the first electrode CE1 of the storage capacitor Cst. That is, the driving control electrode G1 and the first electrode CE1 may be understood to be a single body. The second electrode CE2 of the storage capacitor Cst is provided to overlap the first electrode CE1 with a second gate insulating layer 113 (see FIG. 6) therebetween. In this case, the second gate insulating layer 113 may act as a dielectric layer of the storage capacitor Cst.

The second electrode CE2 may include a storage opening portion SOP. The storage opening portion SOP is formed by removing a portion of the second electrode CE2 and may have a closed shape. The node connection line 166 may be connected to the first electrode CE1 via a first contact hole CNT1 arranged in the storage opening portion SOP. The second electrode CE2 may be connected to the driving voltage line 165 via a seventh contact hole CNT7. The second electrode CE2 may extend in the first direction to transfer the driving voltage ELVDD in the first direction. Accordingly, a plurality of driving voltage lines 165 and a plurality of second electrodes CE2 may form a mesh structure in the display area DA.

The switching thin film transistor T2 includes a switching semiconductor layer and the switching control electrode G2. The switching semiconductor layer includes a switching channel area A2 and a switching source area S2 and a switching drain area D2 on two sides of the switching channel area A2. The switching source area S2 is connected to the data line 171 via a contact hole and a connection electrode, and the switching drain area D2 is connected to the driving source area S1. The switching control electrode G2 is included as a portion of the first scan line SL1.

The operation control thin film transistor T5 includes an operation control semiconductor layer and the operation control electrode G5. The operation control semiconductor layer includes an operation control channel area A5 and an operation control source area S5 and an operation control drain area D5 on two sides of the operation control channel area A5. The operation control source area S5 is connected to the driving voltage line 165 via an eighth contact hole CNT8, and the operation control drain area D5 may be connected to the driving source area S1. The operation control electrode G5 is included as a portion of the emission control line 133.

The emission control thin film transistor T6 includes an emission control semiconductor layer and the emission control electrode G6. The emission control semiconductor layer includes an emission control channel area A6 and an emission control source area S6 and an emission control drain area D6 on two sides of the emission control channel area A6. The emission control source area S6 is connected to the driving drain area D1, and the emission control drain area D6 may be connected to a first connection electrode 167 via a sixth contact hole CNT6. The first connection electrode 167 may be connected to a pixel electrode 310 (see FIG. 7) of the organic light-emitting diode OLED via an upper connection electrode 177 arranged in another layer from the first connection electrode 167. The emission control electrode G6 is included as a portion of the emission control line 133.

The second initialization thin film transistor T7 includes a second initialization semiconductor layer and the first initialization control electrode G7. The second initialization semiconductor layer includes a second initialization channel area A7 and a second initialization source area S7 and a second initialization drain area D7 on two sides of the second initialization channel area A7. The second initialization source area S7 may be connected to the first initialization voltage line 125 arranged in a same layer as the second initialization semiconductor layer, and the second initialization drain area D7 may be connected to the emission control drain area D6. The second initialization control electrode G7 is included as a portion of the next scan line SLn.

A first interlayer insulating layer 114 (see FIG. 6) is arranged on the thin film transistors T1, T2, T5, T6, and T7 including a silicon semiconductor, and the thin film transistors T3 and T4 including an oxide semiconductor may be arranged on the first interlayer insulating layer 114.

The semiconductor layers of the compensation thin film transistor T3 and the first initialization thin film transistor T4 may be arranged on a same layer and include a same material. For example, the semiconductor layers may include an oxide semiconductor.

The semiconductor layers may include a channel area, and a source area and a drain area on two sides of the channel area. For example, the source area and the drain area may be an area having a carrier concentration increased by plasma processing. The source area and the drain area may respectively correspond to a first electrode and a second electrode. Hereinafter, the terms 'source area' and 'drain area' will be used instead of a first electrode or a second electrode.

The compensation thin film transistor T3 includes a compensation semiconductor layer AO3 including an oxide semiconductor and the compensation control electrode G3. The compensation semiconductor layer AO3 includes a compensation channel area A3, and a compensation source area S3 and a compensation drain area D3 on two sides of the compensation channel area A3. The compensation source area S3 may be bridge-connected to the driving control electrode G1 via the node connection line 166. One end of the node connection line 166 may be connected to the compensation source area S3 via a second contact hole CNT2, and the other end of the node connection line 166 may be connected to the driving control electrode G1 via the first contact hole CNT1. Also, the compensation source area S3 may be connected to the first initialization drain area D4 arranged in a same layer. The compensation drain area D3 may be connected to the driving semiconductor layer AS1 of the driving thin film transistor T1 and the emission control semiconductor layer of the emission control thin film transistor T6 via a second connection electrode 168. The compensation control electrode G3 is included as a portion of the second scan line SL2.

The first initialization thin film transistor T4 includes a first initialization semiconductor layer AO4 including an oxide semiconductor and the first initialization control electrode G4. The first initialization semiconductor layer AO4 includes a first initialization channel area A4, and a first initialization source area S4 and a first initialization drain area D4 on two sides of the first initialization channel area A4. The first initialization source area S4 may be connected to the second initialization voltage line 145 via a ninth contact hole CNT9, and the first initialization drain area D4 may be bridge-connected to the driving control electrode G1 via the node connection line 166. The first initialization control electrode G4 is included as a portion of the previous scan line SLp.

A third gate insulating layer 115 (see FIG. 6) is arranged between the compensation semiconductor layer AO3 and the compensation control electrode G3 and between the first initialization semiconductor layer AO4 and the first initialization control electrode G4 to correspond to respective channel areas.

The third electrode CE3, which is an electrode of the boost capacitor Cbt, is included as a portion of the first scan line SL1 to be connected to the switching control electrode G2. The fourth electrode CE4 of the boost capacitor Cbt is arranged to overlap the third electrode CE3 and may include an oxide semiconductor. The fourth electrode CE4 may be arranged on a same layer as the compensation semiconductor layer AO3 of the compensation thin film transistor T3 and the first initialization semiconductor layer of the first initialization thin film transistor T4 to be included as an area between the compensation semiconductor layer AO3 and the first initialization semiconductor layer AO4. Alternatively, the fourth electrode CE4 may extend from the first initialization semiconductor layer AO4. Alternatively, the fourth electrode CE4 may extend from the compensation semiconductor layer AO3.

The second interlayer insulating layer 116 (see FIG. 6) may be arranged on the compensation thin film transistor T3 and the first initialization thin film transistor T4 that include the oxide semiconductor, and the driving voltage line 165, the node connection line 166, and the first and second connection electrodes 167 and 168 may be arranged on the second interlayer insulating layer 116.

In the present embodiment, a first planarization layer 118 (see FIG. 6) may be arranged to cover the driving voltage line 165, and the data line 171 and a shielding electrode 173 may be arranged on the first planarization layer 118.

The shielding electrode 173 may be arranged above the node connection line 166. When the shielding electrode 173 is not arranged above the node connection line 166, the node connection line 166 may form coupling capacitance with the data line 171 and/or the pixel electrode 310 of the display element (see FIG. 6) or the like, that are arranged above the node connection line 166. Accordingly, the thin film transistors connected to the node connection line 166 may be affected by the coupling capacitance.

According to the present embodiment, the shielding electrode 173 may be arranged above the node connection line 166 and a constant voltage may be applied to the shielding electrode 173 to minimize the influence due to the coupling capacitance. In some embodiments, the shielding electrode 173 may be connected to the driving voltage line 165 via a third contact hole CNT3. Accordingly, a driving voltage ELVDD may be applied to the shielding electrode 173.

In some embodiments, the shielding electrode 173 may be formed to completely cover the node connection line 166. In some embodiments, the shielding electrode 173 may be arranged to overlap at least a portion of the driving thin film transistor T1, the compensation thin film transistor T3, and/or the first initialization thin film transistor T4.

Also, as illustrated in FIG. 5A, in some embodiments, the driving voltage line 165 may be arranged to at least partially overlap the data line 171. In addition, a portion of the driving voltage line 165 may be between the data line 171 and the node connection line 166. As the driving voltage line 165 is arranged to overlap the data line 171 and below the data line 171, the components arranged below or besides the data line 171 may be prevented from being affected by a data signal of the data line 171.

In some embodiments, as illustrated in FIG. 5B, the driving voltage line 165 may be arranged not to overlap the data line 171. Even when the driving voltage line 165 does not overlap the data line 171, as the driving voltage line 165 is arranged between the data line 171 and the node connection line 166 in a plan view, a data signal may be prevented from exerting influence in a lateral direction of the node connection line 166. In addition, as the shielding electrode 173 is arranged on an upper surface of the node connection line 166, a data signal may be prevented from exerting influence from above the node connection line 166.

According to an embodiment, the first scan line SL1, the next scan line SLn, and the emission control line 133 may be included in a same layer as the driving control electrode G1 and include a same material as the driving control electrode G1.

According to an embodiment, some of the lines may be included as two conductive layers arranged in different layers from each other. For example, the second scan line SL2 may include a lower scan line 143 and an upper scan line 153 arranged on different layers from each other. The lower scan line 143 may be included in a same layer as and include a same material as the second electrode CE2 of the storage capacitor Cst, and the upper scan line 153 may be arranged on the third gate insulating layer 115 (see FIG. 6). The lower scan line 143 may be arranged to at least partially overlap the upper scan line 153. As the lower scan line 143 and the upper scan line 153 correspond to a portion of the compensation control electrode of the compensation thin film transistor T3, the compensation thin film transistor T3 may have a double gate structure including two control electrodes G3a and G3b (see FIG. 7) disposed in upper and lower portions of the semiconductor layer thereof, respectively. For example, the two control electrodes G3a and G3b correspond to the lower scan line 143 and the upper scan line 153, respectively.

In addition, the previous scan line SLp may include a lower previous scan line 141 and an upper previous scan line 151 arranged on different layers from each other. The lower previous scan line 141 may be included in a same layer as and include a same material as the second electrode CE2 of the storage capacitor Cst, and the upper previous scan line 151 may be arranged on the third gate insulating layer 115 (see FIG. 6). The lower previous scan line 141 may be arranged to at least partially overlap the upper previous scan line 151. As the lower previous scan line 141 and the upper previous scan line 151 correspond to a portion of the first initialization control electrode G4 of the first initialization thin film transistor T4, the first initialization thin film transistor T4 may have a double gate structure including two control electrodes G4a and G4b (see FIG. 6) disposed in upper and lower portions of the semiconductor layer thereof, respectively. For example, the two control electrodes G4a and G4b correspond to the lower previous scan line 141 and the upper previous scan line 151.

Referring to FIG. 5C, the lower previous scan line 141 may protrude to correspond to the first initialization thin film transistor T4. The protruding portion may also function as a second lower control electrode G4a (see FIG. 6) of the first initialization thin film transistor T4. The protruding portion is arranged to completely cover a channel area of the first initialization semiconductor layer AO4 below the first initialization semiconductor layer AO4 and thus, light that may be applied from below the substrate 110 may be blocked by the protruding portion.

Likewise, the lower scan line 143 may protrude to correspond to the compensation thin film transistor T3. The protruding portion may function as a first lower control electrode G3a (see FIG. 7) of the compensation thin film transistor T3. As described above, as the compensation thin film transistor T3 includes a first upper control electrode G3b and the first lower control electrode G3a, to each of which a same signal is applied, the compensation semiconductor layer AO3 may be driven stably. Also, the protruding portion is arranged to completely cover a channel area of the compensation semiconductor layer AO3 below the compensation thin film transistor T3, and thus, light that may be applied from below the substrate 110 may be blocked by the protruding portion.

The initialization voltage line VIL may include the first initialization voltage line 125 and the second initialization voltage line 145 arranged on different layers from each other. The first initialization voltage line 125 may be included on a same layer as and include a same material as the semiconductor layer of the driving thin film transistor T1, and the second initialization voltage line 145 may be included on a same layer as and include a same material as the second electrode CE2 of the storage capacitor Cst.

Hereinafter, a structure of a display apparatus according to an embodiment will be described in detail with reference to FIGS. 6 and 7 according to a stacking order. In FIGS. 6 and 7, structures of the driving thin film transistor T1, the compensation thin film transistor T3, the first initialization thin film transistor T4, the emission control thin film transistor T6, the storage capacitor Cst, and the boost capacitor Cbt are mainly illustrated, and some components may be omitted.

Referring to FIGS. 6 and 7, the display apparatus according to an embodiment includes the substrate 110, a first thin film transistor (e.g., the driving thin film transistor T1) including a silicon semiconductor, a second thin film transistor (e.g., the first initialization thin film transistor T4) including an oxide semiconductor, the node connection line 166 connecting a first control electrode of the first thin film transistor to a second semiconductor layer of the second thin film transistor, and the shielding electrode 173 arranged to overlap the node connection line 166 above the node connection line 166. The shielding electrode 173 may be connected to the driving voltage line 165 via a contact hole (e.g., a third contact hole CNT3). The first thin film transistor may be the driving thin film transistor T1, and the second thin film transistor may the first initialization thin film transistor T4. The second thin film transistor may also be the compensation thin film transistor T3 with a semiconductor layer including an oxide semiconductor. The semiconductor layer of the thin film transistor T3 may be connected to the control electrode G1 of the driving thin film transistor T1 via the node connection line 166.

Also, the display apparatus may further include various insulating layers such as the buffer layer 111, the first gate insulating layer 112, the second gate insulating layer 113, the third gate insulating layer 115, the first interlayer insulating layer 114, the second interlayer insulating layer 116, the first planarization layer 118, and a second planarization layer 119.

The substrate 110 may include a glass material, a ceramic material, a metal material, or a flexible or bendable material. When the substrate 110 is flexible or bendable, the substrate 110 may include a polymer resin such as polyethersulphone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP). The substrate 110 may have a single layer structure or a multi-layer structure of the above-described material, and may further include an inorganic layer in the case of the multi-layer structure. In some embodiments, the substrate 110 may have a structure of organic material/inorganic material/organic material.

The buffer layer 111 may perform a function of increasing the smoothness of an upper surface of the substrate 110, and the buffer layer 111 may include an oxide layer such as silicon oxide ($SiO_x$), and/or a nitride layer such as silicon nitride ($SiN_x$), or silicon oxynitride (SiON).

A barrier layer (not shown) may be further included between the substrate 110 and the buffer layer 111. The barrier layer may prevent or minimize penetration of impurities from the substrate 110 into a silicon semiconductor layer. The barrier layer may include an inorganic material such as an oxide or a nitride, and/or an organic material, and have a single-layer or multi-layer structure including an inorganic material and an organic material.

The driving semiconductor layer AS1 and an emission control semiconductor layer AS6, which are semiconductor layers including a silicon semiconductor, may be arranged on the buffer layer 111.

The driving semiconductor layer AS1 may include the driving source area S1 and the driving drain area D1 that are doped with impurities to have conductivity and spaced apart from each other and the driving channel area A1 arranged between the driving source area S1 and the driving drain area D1. The driving source area S1 and the driving drain area D1 may respectively correspond to the first electrode and the second electrode of the driving thin film transistor T1, and the positions of the driving source area S1 and the driving drain area D1 may be interchanged.

The emission control semiconductor layer AS6 may include the emission control source area S6 and the emission control drain area D6, which are doped with impurities to have conductivity and are arranged apart from each other, and the emission control channel area A6 arranged between the emission control source area S6 and the emission control drain area D6. The emission control source area S6 and the emission control drain area D6 may respectively correspond to the first electrode and the second electrode of the emission control thin film transistor T6, and the positions of the emission control source area S6 and the emission control drain area D6 may be interchanged.

The driving control electrode G1 is arranged on the driving semiconductor layer AS1, and the emission control electrode G6 is arranged on the emission control semiconductor layer AS6. The first gate insulating layer 112 may be arranged between the driving semiconductor layer AS1 and the driving control electrode G1 and between the emission control semiconductor layer AS6 and the emission control electrode G6.

The first gate insulating layer 112 may include an inorganic material including oxide or nitride. For example, the first gate insulating layer 112 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The driving control electrode G1 is arranged to overlap the driving channel area A1 and may include a single layer or a multi-layer including at least one of molybdenum (Mo), copper (Cu), and titanium (Ti).

The storage capacitor Cst may be arranged on the semiconductor layer of the driving thin film transistor T1. The storage capacitor Cst includes the first electrode CE1 and the second electrode CE2. The second gate insulating layer 113 may be arranged between the first electrode CE1 and the second electrode CE2. The driving control electrode G1 may function not only as a control electrode of the driving thin film transistor T1 but also as the first electrode CE1 of the storage capacitor Cst. That is, the driving control electrode G1 and the first electrode CE1 may be understood to be a single body.

The second gate insulating layer 113 may include an inorganic material including oxide or nitride. For example, the second gate insulating layer 113 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The second electrode CE2 is arranged on the second gate insulating layer 113 to overlap the first electrode CE1. The second electrode CE2 may include a storage opening portion SOP. The storage opening portion SOP is formed by removing a portion of the second electrode CE2 and may have a closed shape. The first contact hole CNT1 defined in the second gate insulating layer 113 may be arranged in the storage opening portion SOP. The driving control electrode G1 and the node connection line 166 may be connected to each other via the first contact hole CNT1. The second electrode CE2 may include at least one of molybdenum (Mo), copper (Cu), and titanium (Ti) and include a single layer or multiple layers.

The first interlayer insulating layer 114 may be arranged on the second electrode CE2. The first interlayer insulating layer 114 may include an inorganic material including oxide or nitride. For example, the first interlayer insulating layer 114 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The compensation semiconductor layer AO3 and the first initialization semiconductor layer AO4 that include an oxide semiconductor may be arranged on the first interlayer insulating layer 114. The compensation semiconductor layer AO3 may include the compensation source area S3 and the compensation drain area D3 having conductivity and spaced apart from each other and the compensation channel area A3 between the compensation source area S3 and the compensation drain area D3.

The first initialization semiconductor layer AO4 may include the first initialization source area S4 and the first initialization drain area D4 having conductivity and spaced apart from each other and the first initialization channel area A4 between the first initialization source area S4 and the first initialization drain area D4.

The compensation semiconductor layer AO3 and the first initialization semiconductor layer AO4 may include a Zn oxide-based material, and may include, for example, Zn oxide, In—Zn oxide, Ga—In—Zn oxide, or the like. In some embodiments, the compensation semiconductor layer AO3 and the first initialization semiconductor layer AO4 may include In—Ga—Zn—O (IGZO), In—Sn—Zn—O (ITZO), or In—Ga—Sn-Zn—O (IGTZO) semiconductor, which includes metal such as In, Ga, and tin (Sn) in ZnO.

The compensation source area S3, the compensation drain area D3, the first initialization source area S4, and the first initialization drain area D4 may be formed to have conductivity by adjusting a carrier concentration in an oxide semiconductor. For example, the compensation source area S3 and the compensation drain area D3 and the first initialization source area S4 and the first initialization drain area D4 may be formed by increasing a carrier concentration of an oxide semiconductor by performing plasma processing on the oxide semiconductor by using a hydrogen (H)-based gas, fluorine (F)-based gas, or a combination thereof.

The first lower control electrode G3$a$ may be arranged below the compensation semiconductor layer AO3, and the first upper control electrode G3$b$ may be arranged on the compensation semiconductor layer AO3. That is, the compensation thin film transistor T3 may include a double control electrode. As described above, as the compensation thin film transistor T3 includes the first upper control electrode G3$b$ and the first lower control electrode G3$a$, to each of which a same signal is applied, the compensation semiconductor layer AO3 may be driven stably. In addition, light that may be applied from below the substrate 110 may be blocked by using the first lower control electrode G3$a$.

The second lower control electrode G4$a$ may be arranged below the first initialization semiconductor layer AO4, and a second upper control electrode G4$b$ may be arranged on the first initialization semiconductor layer AO4. That is, the first initialization thin film transistor T4 may include a double control electrode. As described above, as the first initialization thin film transistor T4 includes the second upper control electrode G4$b$ and the second lower control electrode G4$a$, to each of which a same signal is applied, the first initialization semiconductor layer AO4 may be driven stably. In addition, light that may be applied from below the substrate 110 may be blocked by using the second lower control electrode G4$a$.

The first interlayer insulating layer 114 may be arranged between the first lower control electrode G3$a$ and the compensation semiconductor layer AO3 and between the second lower control electrode G4$a$ and the first initialization semiconductor layer AO4. The first lower control electrode G3$a$ and the second lower control electrode G4$a$ may be arranged on a same layer (e.g., the second gate insulating layer 113) as and include a same material as the second electrode CE2 of the storage capacitor Cst.

The third gate insulating layer 115 may be arranged between the compensation semiconductor layer AO3 and the first upper control electrode G3$b$ and between the first initialization semiconductor layer AO4 and the second upper control electrode G4b. The first upper control electrode G3b is arranged to overlap the compensation channel area A3 and is insulated from the compensation semiconductor layer AO3 by the third gate insulating layer 115. The second upper control electrode G4b is arranged to overlap the first initialization channel area A4 and is insulated from the first initialization semiconductor layer AO4 by the third gate insulating layer 115.

The third gate insulating layer 115 may be formed through a same mask process as the first upper control electrode G3b and the second upper control electrode G4b. In this case, the third gate insulating layer 115 may be formed in a same shape as the first upper control electrode G3b and the second upper control electrode G4b.

The third gate insulating layer 115 may include an inorganic material including an oxide or a nitride. For example, the third gate insulating layer 115 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first upper control electrode G3b and the second upper control electrode G4b may be arranged on the third gate insulating layer 115 and include at least one of molybdenum (Mo), copper (Cu), and titanium (Ti) and include a single layer or multiple layers.

The boost capacitor Cbt includes the third electrode CE3 and the fourth electrode CE4. The third electrode CE3 and the driving control electrode G1 may be arranged on a same layer (e.g., the first gate insulating layer 112). The fourth electrode CE4 may extend from the first initialization semiconductor layer AO4 or the compensation semiconductor layer AO3. That is, the fourth electrode CE4 may include an oxide semiconductor and be arranged on the first interlayer insulating layer 114. The second gate insulating layer 113 and the first interlayer insulating layer 114 may be arranged between the third electrode CE3 and the fourth electrode CE4, and the second gate insulating layer 113 and the first interlayer insulating layer 114 may act as a dielectric layer of the boost capacitor Cbt.

The fourth electrode CE4 of the boost capacitor Cbt may be connected to the node connection line 166 to be electrically connected to the driving control electrode G1. Accordingly, as the boost capacitor Cbt raises a voltage of the first node N1 (see FIG. 3) when the first scan signal Sn supplied to the first scan line SL1 is turned off, black gradation may be clearly displayed.

The second interlayer insulating layer 116 covers thin film transistors which include an oxide semiconductor, such as the compensation thin film transistor T3, the first initialization thin film transistor T4, or the like. The second interlayer insulating layer 116 may be arranged on the first upper control electrode G3b and the second upper control electrode G4b, and the driving voltage line 165, the node connection line 166, and the first and second connection electrodes 167 and 168 may be arranged on the second interlayer insulating layer 116.

The second interlayer insulating layer 116 may include an inorganic material including oxide or nitride. For example, the second interlayer insulating layer 116 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The driving voltage line 165, the node connection line 166, and the first and second connection electrodes 167 and 168 may be a highly conductive material such as metal or conductive oxide. For example, the driving voltage line 165, the node connection line 166, and the first and second connection electrodes 167 and 168 may include a single layer or a multi-layer including at least one of aluminum (Al), copper (Cu), and titanium (Ti). In some embodiments, the driving voltage line 165, the node connection line 166, and the first and second connection electrodes 167 and 168 may include a triple layer including Ti, Al, and Ti (Ti/Al/Ti) that are sequentially arranged.

One end of the node connection line 166 may be connected to the driving control electrode G1 via the first contact hole CNT1. The first contact hole CNT1 may pass through the second interlayer insulating layer 116, the first interlayer insulating layer 114, and the second gate insulating layer 113, and expose the driving control electrode G1. As a portion of the node connection line 166 is inserted into the first contact hole CNT1, the node connection line 166 may be electrically connected to the driving control electrode G1.

Meanwhile, the first contact hole CNT1 may be arranged apart from edges of the storage opening portion SOP in the storage opening portion SOP of the second electrode CE2, and accordingly, the node connection line 166 inserted into the first contact hole CNT1 may be electrically insulated from the second electrode CE2.

The other end of the node connection line 166 may be connected to an oxide semiconductor layer, for example, the fourth electrode CE4 of the boost capacitor Cbt or the first initialization semiconductor layer AO4, via the second contact hole CNT2. The second contact hole CNT2 may pass through the second interlayer insulating layer 116 to be connected to the oxide semiconductor layer of the first initialization thin film transistor T4.

Referring to FIG. 7, the first connection electrode 167 may be connected to the emission control semiconductor layer AS6 via the sixth contact hole CNT6. The sixth contact hole CNT6 may pass through the second interlayer insulating layer 116, the first interlayer insulating layer 114, the second gate insulating layer 113, and the first gate insulating layer 112, and expose a portion of the emission control semiconductor layer AS6. As a portion of the first connection electrode 167 is inserted into the sixth contact hole CNT6, and the first connection electrode 167 may be electrically connected to the emission control semiconductor layer AS6. The first connection electrode 167 may be connected to the pixel electrode 310 to transfer a signal applied via the emission control thin film transistor T6, to the pixel electrode 310.

One end of the second connection electrode 168 may be connected to the emission control semiconductor layer AS6 via a fourth contact hole CNT4. The other end of the second connection electrode 168 may be connected to the compensation semiconductor layer AO3 via a fifth contact hole CNT5.

The first planarization layer 118 is arranged on the node connection line 166, the driving voltage line 165, and the first and second connection electrodes 167 and 168. The first planarization layer 118 may include an organic material such as acryl, benzocyclobutene (BCB), PI, or hexamethyldisiloxane (HMDSO). Alternatively, the first planarization layer 118 may include an inorganic material. The first planarization layer 118 acts as a protective layer covering the thin film transistors T1 through T7, and an upper portion of the first planarization layer 118 is planarized. The first planarization layer 118 may include a single layer or a multi-layer.

The data line 171, the shielding electrode 173, and the upper connection electrode 177 may be arranged on the first planarization layer 118. The data line 171 may partially overlap the driving voltage line 165. A portion R1 of the driving voltage line 165 may be between the data line 171 and the node connection line 166 in a plan view. For example, the portion R1 of the driving voltage line 165 may overlap a region between the data line 171 and the node connection line 166. Accordingly, the driving voltage line 165 may reduce coupling in a horizontal direction of the node connection line 166 and the data line 171.

The shielding electrode 173 may be arranged above the node connection line 166 to overlap the node connection line 166. Accordingly, the shielding electrode 173 may reduce coupling in a vertical direction of the node connection line 166 and the data line 171.

The upper connection electrode 177 may be connected to the first connection electrode 167 via a contact hole defined in the first planarization layer 118. The data line 171, the shielding electrode 173, and the upper connection electrode 177 may include a conductive material such as metal, for example. For example, the data line 171, the shielding electrode 173, and the upper connection electrode 177 may include Al, Cu, and Ti, and may include a single layer or a multi-layer.

The organic light-emitting diode OLED including the pixel electrode 310, an opposite electrode 330, and an intermediate layer 320 arranged therebetween and including an emission layer may be on the second planarization layer 119.

The pixel electrode 310 may be connected to the upper connection electrode 177 via a contact hole defined in the second planarization layer 119, and may be connected to the emission control drain area D6 of the emission control thin film transistor T6 via the upper connection electrode 177 and the first connection electrode 167.

A pixel defining layer 120 may be arranged on the second planarization layer 119. The pixel defining layer 120 has an opening corresponding to each sub-pixel, that is an opening exposing a center portion of at least the pixel electrode 310, thereby defining a pixel. In addition, the pixel defining layer 120 may increase a distance between an edge of the pixel electrode 310 and the opposite electrode 330 above the pixel electrode 310 to prevent an arc or the like at the edge of the pixel electrode 310. The pixel defining layer 120 may include an organic material such as PI or HMDSO.

The intermediate layer 320 of the organic light-emitting diode OLED may include a low molecular weight material or a polymer material. When the intermediate layer 320 includes a low molecular weight material, the intermediate layer 320 may have a structure in which a hole injection layer (HIL), a hole transport layer (HTL), an emission layer (EML), an electron transport layer (ETL), an electron injection layer (EIL), or the like are stacked in a single structure or a complex structure, and may include various organic materials including copper phthalocyanine (CuPc), N,N-di(naphthalen-1-yl)-N, N'-diphenyl-benzidine (NPB), tris-8-hydroxyquinoline aluminum (Alq3), or the like. The above-described layers may be formed using a vacuum deposition method.

When the intermediate layer 320 includes a polymer material, the intermediate layer 320 may typically have a structure including an HTL and an EML. The HTL may include poly(3,4-ethylenedioxythiophene) (PEDOT), and the EML may include a polymer material such as a polyphenylene vinylene (PPV)-based material or a polyfluorene-based material. The intermediate layer 320 may be formed using, for example, a screen printing method, an inkjet printing method, or a laser induced thermal imaging (LITI) method.

The intermediate layer 320 is not limited thereto, and may also have other various structures. The intermediate layer 320 may include a layer formed as a single body with respect to a plurality of pixel electrodes 310, or may include a layer patterned to respectively correspond to the plurality of pixel electrodes 310.

The opposite electrode 330 may be integrally formed with respect to a plurality of organic light-emitting diodes to correspond to a plurality of pixel electrodes 310.

As the organic light-emitting diode OLED is likely to be damaged by moisture or oxygen from the outside, a thin film encapsulation layer (not shown) or an encapsulation substrate (not shown) may be arranged on the organic light-emitting diode OLED to cover and protect the organic light-emitting diode OLED. The thin film encapsulation layer (not shown) may cover the display area DA and extend beyond the display area DA. The thin film encapsulation layer may include an inorganic encapsulation layer including at least one inorganic material and an organic encapsulation layer including at least one organic material. In some embodiments, the thin film encapsulation layer may have a structure in which a first inorganic encapsulation layer/organic encapsulation layer/second inorganic encapsulation layer are stacked. The encapsulation substrate (not shown) may be arranged to face the substrate 110, and may be bonded to the substrate 110 in the peripheral area PA (see FIG. 1) by using an encapsulation member such as a sealant or a frit.

In addition, a spacer may be further included on the pixel defining layer 120 to prevent damage caused by mask, and various functional layers such as a polarization layer, a black matrix, a color filter, and/or a touch screen layer including a touch electrode to reduce external light reflection may be provided on the thin film encapsulation layer.

Figure 8:
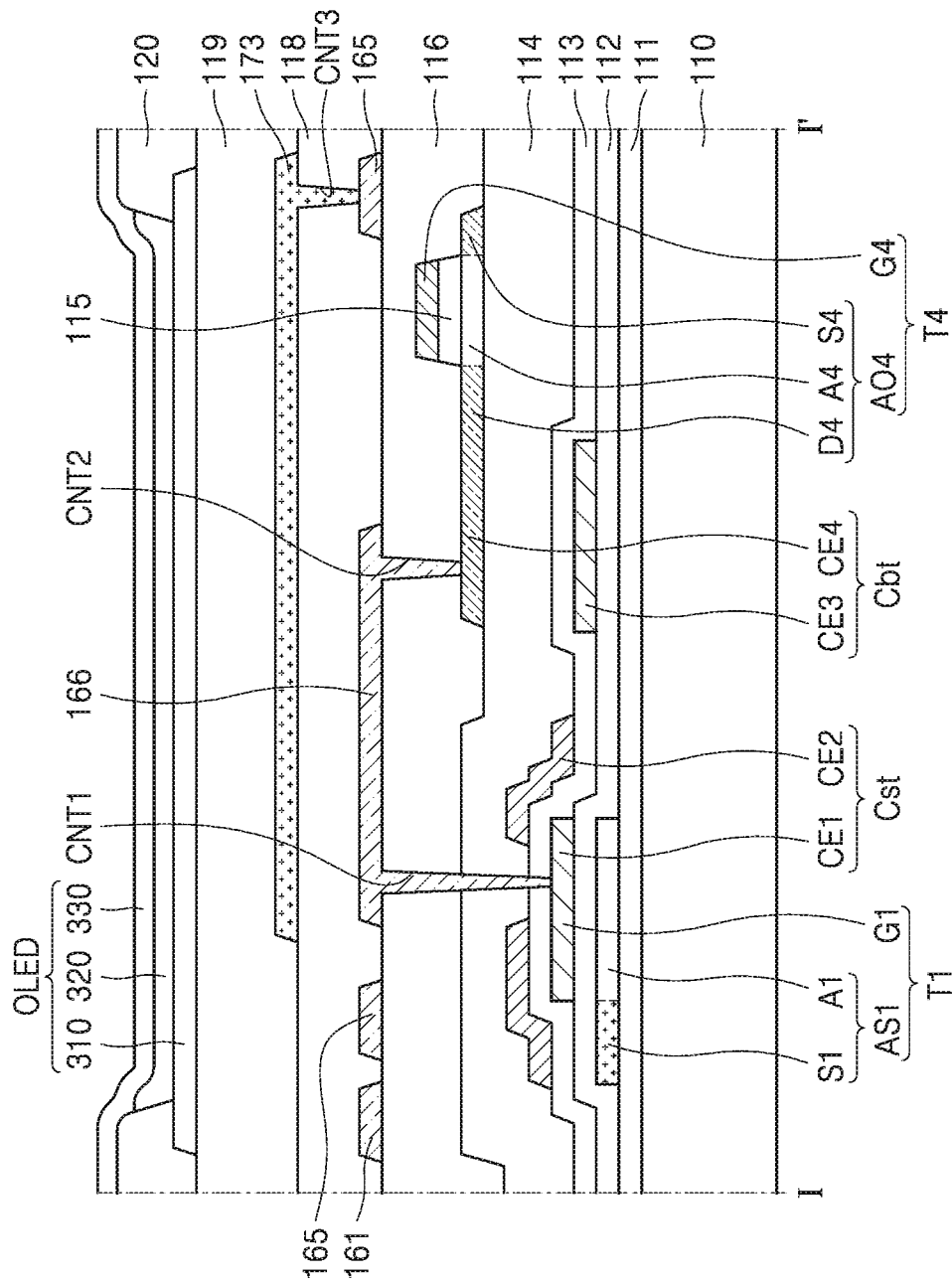
FIG. 8 is a cross-sectional view of a display apparatus according to an embodiment.

FIG. 8 is a schematic cross-sectional view of a display apparatus according to an embodiment. In FIG. 8, like reference numerals as those of FIG. 6 denote like elements, and thus redundant description thereof will be omitted.

Referring to FIG. 8, the display apparatus according to an embodiment includes the substrate 110, a first thin film transistor (e.g., the driving thin film transistor T1) including a silicon semiconductor, a second thin film transistor (e.g., the first initialization thin film transistor T4) including an oxide semiconductor, the node connection line 166 connecting a first control electrode of the first thin film transistor to a second semiconductor layer of the second thin film transistor, and the shielding electrode 173 arranged to overlap the node connection line 166 above the node connection line 166. The shielding electrode 173 may be connected to the driving voltage line 165 via a contact hole. The first thin film transistor may be the driving thin film transistor T1, and the second thin film transistor may be the first initialization thin film transistor T4. The second thin film transistor may also be the compensation thin film transistor T3 with a semiconductor layer including an oxide semiconductor. The semiconductor layer of the thin film transistor T3 may be connected to the control electrode G1 of the driving thin film transistor T1 via the node connection line 166.

In the present embodiment, a data line 161 may be arranged on a same layer (e.g., the second interlayer insulating layer 116) as the driving voltage line 165 and the node connection line 166. In this case, the driving voltage line 165 may be arranged to be apart from each of the data line 161 and the node connection line 166 between the data line 161 and the node connection line 166. As the driving voltage line 165, to which a constant voltage is applied, is arranged between the data line 161 and the node connection line 166, coupling effects that may occur between the data line 161 and the node connection line 166 may be minimized.

Also, in the present embodiment, as the shielding electrode 173 is arranged above the node connection line 166, coupling effects that may occur between the node connection line 166 and the pixel electrode 310 or the like may be minimized.

Meanwhile, in the present embodiment, the first initialization thin film transistor T4 may have a top-gate structure including the first initialization control electrode G4 arranged on the third gate insulating layer 115.

Figure 9:
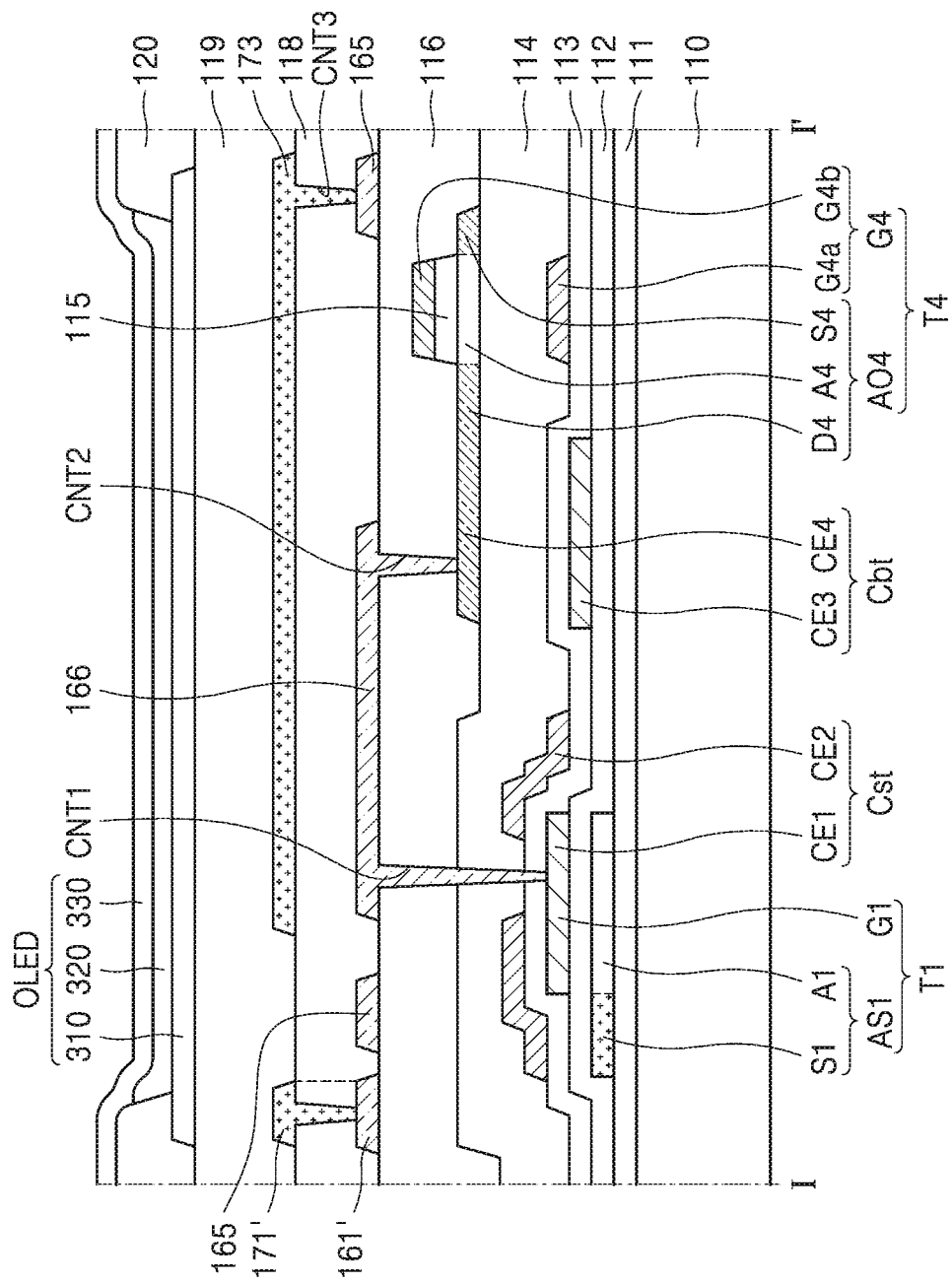
FIG. 9 is a cross-sectional view of a display apparatus according to an embodiment.

FIG. 9 is a schematic cross-sectional view of a display apparatus according to an embodiment. In FIG. 9, like reference numerals as those of FIG. 6 denote like elements, and thus redundant description thereof will be omitted.

Referring to FIG. 9, the display apparatus according to an embodiment includes the substrate 110, a first thin film transistor (e.g., the driving thin film transistor T1) including a silicon semiconductor, a second thin film transistor (e.g., the first initialization thin film transistor T4) including an oxide semiconductor, the node connection line 166 connecting a first control electrode of the first thin film transistor to a second semiconductor layer of the second thin film transistor, and the shielding electrode 173 arranged to overlap the node connection line 166 above the node connection line 166. The shielding electrode 173 may be connected to the driving voltage line 165 via a contact hole. The first thin film transistor may be the driving thin film transistor T1, and the second thin film transistor may be the first initialization thin film transistor T4. The second thin film transistor may also be the compensation thin film transistor T3 with a semiconductor layer including an oxide semiconductor. The semiconductor layer of the thin film transistor T3 may be connected to the control electrode G1 of the driving thin film transistor T1 via the node connection line 166.

According to the present embodiment, a data line may include a lower data line 161' and an upper data line 171' arranged on different layers from each other. The lower data line 161' may be arranged on a same layer (e.g., the second interlayer insulating layer 116) as the node connection line 166. The upper data line 171' may be arranged on a same layer (e.g., the first planarization layer 118) as the shielding electrode 173. The upper data line 171' may be connected to the lower data line 161' via a contact hole.

In the present embodiment, the driving voltage line 165 may be arranged to be apart from each of the lower data line 161' and the node connection line 166 between the lower data line 161' and the node connection line 166. As the driving voltage line 165, to which a constant voltage is applied, is arranged between the lower data line 161' and the node connection line 166, coupling effects that may occur between the lower data line 161' and the node connection line 166 may be minimized.

Also, in the present embodiment, as the shielding electrode 173 is arranged above the node connection line 166, coupling effects that may occur between the node connection line 166 and the upper data line 171' and/or the pixel electrode 310 or the like may be minimized.

According to an embodiment as described above, a driving circuit driving a display element is configured to include a first thin film transistor including a silicon semiconductor and a second thin film transistor including an oxide semiconductor, and accordingly, a high-resolution display apparatus having low power consumption may be provided.

Also, due to the shielding electrode overlapping the node connection line connected to the first thin film transistor, effects caused by a coupling capacitance may be minimized.

In addition, due to the boost capacitor, black gradation may be clearly realized.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate including a display area in which a display element is arranged;
a first thin film transistor arranged in the display area and including a first semiconductor layer and a first control electrode;
a first interlayer insulating layer covering the first control electrode;
a node connection line arranged over the first interlayer insulating layer and connected to the first control electrode via a first contact hole;
a first planarization layer covering the node connection line; and
a shielding electrode arranged on the first planarization layer to overlap the node connection line.

2. The display apparatus of claim 1, further comprising:
a second thin film transistor arranged on the first interlayer insulating layer and including a second semiconductor layer and a second control electrode; and
a second interlayer insulating layer disposed between the second control electrode and the node connection line;
wherein the node connection line is connected to the second semiconductor layer via a second contact hole.

3. The display apparatus of claim 2, wherein
the second thin film transistor further comprises a third control electrode arranged below the second semiconductor layer to overlap the second semiconductor layer.

4. The display apparatus of claim 3, further comprising:
a storage capacitor including the first control electrode as a first electrode and a second electrode arranged above the first control electrode,
wherein the third control electrode and the second electrode of the storage capacitor are arranged on a second gate insulating layer.

5. The display apparatus of claim 2, further comprising:
a driving voltage line arranged on the second interlayer insulating layer on which the node connection line is arranged,
wherein the shielding electrode is connected to the driving voltage line via a third contact hole.

6. The display apparatus of claim 2, further comprising:
a driving voltage line arranged on the second interlayer insulating layer on which the node connection line is arranged; and
a data line arranged on the first planarization layer on which the shielding electrode is arranged,
wherein the driving voltage line at least partially overlaps the data line.

7. The display apparatus of claim 6, wherein
a portion of the driving voltage line overlaps a region between the data line and the shielding electrode in a plan view.

8. The display apparatus of claim 2, further comprising:
a driving voltage line arranged on the second interlayer insulating layer on which the node connection line is arranged; and
a data line arranged on the first planarization layer on which the shielding electrode is arranged, and
wherein the driving voltage line overlaps a region between the data line and the shielding electrode in a plan view.

9. The display apparatus of claim 1, further comprising a boost capacitor comprising a lower electrode arranged on a first gate insulating layer and an upper electrode arranged on the first interlayer insulating layer.

10. The display apparatus of claim 2, further comprising a data line and a driving voltage line that are arranged on the second interlayer insulating layer on which the node connection line is arranged,
wherein the driving voltage line is arranged between the data line and the node connection line.

11. The display apparatus of claim 2, further comprising:
a lower data line arranged on the second interlayer insulating layer on which the node connection line is arranged; and
an upper data line arranged on the first planarization layer and connected to the lower data line via a contact hole.

12. The display apparatus of claim 11, further comprising a driving voltage line arranged on the second interlayer insulating layer on which the node connection line is arranged,
wherein the driving voltage line is arranged between the lower data line and the node connection line.

13. The display apparatus of claim 1, further comprising a second planarization layer covering the shielding electrode,
wherein the display element comprises an organic light-emitting diode arranged on the second planarization layer.

14. A display apparatus comprising:
a substrate including a display area in which a display element is arranged;
a first thin film transistor arranged in the display area and including a first semiconductor layer and a first control electrode;
a first interlayer insulating layer covering the first control electrode;
a second thin film transistor arranged on the first interlayer insulating layer and including a second semiconductor layer and a second control electrode; and
a boost capacitor comprising a lower electrode and an upper electrode, wherein the lower electrode and the first control electrode are arranged on a first layer and the upper electrode and the second semiconductor layer are arranged on a second layer different from the first layer.

15. The display apparatus of claim 14, wherein the upper electrode is part of the second semiconductor layer.

16. The display apparatus of claim 14, further comprising:
a node connection line connecting the first control electrode to the second semiconductor layer; and
a shielding electrode arranged above the node connection line to overlap the node connection line.

17. The display apparatus of claim 16, further comprising a driving voltage line electrically connected to the shielding electrode,
wherein the driving voltage line and the node connection line are arranged on a third layer covering the second thin film transistor.

18. The display apparatus of claim 16, further comprising:
a driving voltage line arranged on a third layer on which the node connection line is arranged; and
a data line arranged on a fourth layer on which the shielding electrode is arranged,
wherein the driving voltage line at least partially overlaps the data line.

19. The display apparatus of claim 18, wherein a portion of the driving voltage line overlaps a region between the data line and the shielding electrode in a plan view.

20. The display apparatus of claim 14, wherein the first semiconductor layer includes silicon, and the second semiconductor layer includes an oxide semiconductor.

21. A display apparatus comprising:
a substrate;
a display element disposed on the substrate; and
a pixel circuit disposed between the substrate and the display element and connected the display element by a connection electrode;
wherein the pixel circuit comprising:
a first thin film transistor including a first semiconductor layer and a first control electrode;
a second thin film transistor disposed on a different layer from the first thin film transistor including a second semiconductor layer and a second control electrode; and
a shielding electrode disposed on a same layer as the connection electrode.

22. The display apparatus of claim 21,
wherein the pixel circuit further comprising:
a first scan line extending a first direction; and
a data line extending a second direction crossing the first direction,
wherein the data line is disposed on a same layer as the shielding electrode.

23. The display apparatus of claim 21,
wherein the pixel circuit further comprising a storage capacitor including a first electrode and a second electrode over the first electrode,
wherein the second control electrode includes a lower control electrode disposed under the second semiconductor layer and an upper control electrode over the second semiconductor layer, and
the lower control electrode is disposed on a same layer as a second electrode.

24. The display apparatus of claim 21,
wherein the pixel circuit further comprising:
a node connection line connected to the first control electrode via a first contact hole;
a first scan line extending a first direction and disposed on a same layer as the first control electrode; and
a second scan line extending the first direction and disposed on a same layer as the second control electrode,
wherein the node connection line is overlapped with the first scan line and the second scan line.

25. The display apparatus of claim 24,
wherein the shielding electrode is overlapped with the node connection line.

26. A display apparatus comprising:
a substrate;
a display element disposed on the substrate; and a pixel circuit disposed between the substrate and the display element and connected the display element by a connection electrode;
wherein the pixel circuit comprising:
a first thin film transistor including a first semiconductor layer and a first control electrode;
a second thin film transistor disposed on a different layer from the first thin film transistor, and including a second semiconductor layer and a second control electrode;
a node connection line connected to the first control electrode via a first contact hole and connected to the second semiconductor layer via a second contact hole; and
a shielding electrode disposed on a same layer as the connection electrode, wherein the first contact hole has a different height from the second contact hole.

27. The display apparatus of claim 26,
wherein the pixel circuit further comprising:
a first interlayer insulating layer disposed between the first control electrode and the second semiconductor layer; and
a second interlayer insulating layer disposed between the second semiconductor layer and the node connection line,
wherein the first contact hole penetrates the first interlayer insulating layer and the second interlayer insulating layer, and the second contact hole penetrates the second interlayer insulating layer.

28. The display apparatus of claim 26,
wherein the pixel circuit further comprising a storage capacitor including a first electrode and a second electrode over the first electrode,
wherein the second control electrode includes a lower control electrode disposed under the second semiconductor layer and an upper control electrode over the second semiconductor layer, and
the lower control electrode is disposed on a same layer as a second electrode.

29. The display apparatus of claim 26,
wherein the pixel circuit further comprising:
a node connection line connected to the first control electrode via a first contact hole;
a first scan line extending a first direction and disposed on a same layer as the first control electrode; and
a second scan line extending the first direction and disposed on a same layer as the second control electrode,
wherein the node connection line is overlapped with the first scan line and the second scan line.

30. The display apparatus of claim 26,
wherein the shielding electrode is overlapped with the node connection line.

* * * * *